US012757471B2

(12) United States Patent
Wu et al.

(10) Patent No.: US 12,757,471 B2
(45) Date of Patent: Oct. 6, 2026

(54) GATE STRUCTURE IN HIGH-κ METAL GATE TECHNOLOGY

(71) Applicant: Taiwan Semiconductor Manufacturing Company, Ltd., Hsinchu (TW)

(72) Inventors: Wei Cheng Wu, Zhubei City (TW); Alexander Kalnitsky, San Francisco, CA (US); Shih-Hao Lo, Zhubei City (TW); Hung-Pin Ko, Hsinchu City (TW)

(73) Assignee: Taiwan Semiconcutor Manufacturing Company, Ltd., Hsinchu (TW)

( * ) Notice: Subject to any disclaimer, the term of this patent is extended or adjusted under 35 U.S.C. 154(b) by 19 days.

(21) Appl. No.: 18/655,397

(22) Filed: May 6, 2024

(65) Prior Publication Data

US 2024/0290859 A1 Aug. 29, 2024

Related U.S. Application Data

(60) Continuation of application No. 17/735,349, filed on May 3, 2022, now Pat. No. 12,009,402, which is a division of application No. 16/580,296, filed on Sep. 24, 2019, now Pat. No. 11,335,786.

(60) Provisional application No. 62/799,939, filed on Feb. 1, 2019.

(51) Int. Cl.
*H10D 64/01* (2025.01)
*H10D 64/27* (2025.01)

(52) U.S. Cl.
CPC ......... *H10D 64/518* (2025.01); *H10D 64/017* (2025.01); *H10D 64/018* (2025.01)

(58) Field of Classification Search
CPC .. H10D 30/027; H10D 30/0323; H10D 30/60; H10D 30/6739; H10D 30/6744; H10D 62/83; H10D 64/017; H10D 64/018; H10D 64/021; H10D 64/518; H10D 64/62; H10D 64/666; H10D 64/685; H10D 64/691
See application file for complete search history.

(56) References Cited

U.S. PATENT DOCUMENTS

| | | |
|---|---|---|
| 8,252,675 B2 | 8/2012 | Lee et al. |
| 9,490,255 B1 | 11/2016 | Edge et al. |
| 9,847,347 B1 | 12/2017 | Smith et al. |

(Continued)

OTHER PUBLICATIONS

Non-Final Office Action dated Mar. 31, 2021 for U.S. Appl. No. 16/580,296.

(Continued)

*Primary Examiner* — Hoai V Pham
(74) *Attorney, Agent, or Firm* — Eschweiler & Potashnik, LLC

(57) ABSTRACT

Various embodiments of the present disclosure are directed towards an integrated chip including a gate dielectric structure on a semiconductor substrate. A gate electrode structure is on the gate dielectric structure. The gate electrode structure includes a lower conductive structure and a gate body structure. The gate body structure includes an upper segment over a top surface of the lower conductive structure and a lower segment disposed between opposing inner sidewalls of the lower conductive structure.

20 Claims, 12 Drawing Sheets

300a

(56) References Cited

U.S. PATENT DOCUMENTS

| | | | | |
|---|---|---|---|---|
| 2005/0116279 | A1* | 6/2005 | Koh | H10D 30/0411 438/257 |
| 2006/0289900 | A1* | 12/2006 | Thirupapuliyur | H10D 84/0167 257/E29.085 |
| 2008/0113480 | A1 | 5/2008 | Nishida et al. | |
| 2011/0081774 | A1 | 4/2011 | Yeh et al. | |
| 2011/0147858 | A1 | 6/2011 | Lim et al. | |
| 2011/0309434 | A1 | 12/2011 | Huang et al. | |
| 2013/0049924 | A1* | 2/2013 | Yang | H10D 84/811 257/E21.004 |
| 2014/0103403 | A1* | 4/2014 | Kim | H10D 64/01354 257/288 |
| 2014/0319620 | A1 | 10/2014 | Hoentschel et al. | |
| 2014/0367788 | A1* | 12/2014 | Xie | H10D 64/668 438/587 |
| 2015/0050787 | A1 | 2/2015 | Flachowsky et al. | |
| 2016/0225871 | A1 | 8/2016 | Cheng et al. | |

OTHER PUBLICATIONS

Final Office Action dated Jul. 30, 2021 for U.S. Appl. No. 16/580,296.
Notice of Allowance dated Dec. 14, 2021 for U.S. Appl. No. 16/580,296.
Non-Final Office Action dated Jul. 20, 2023 for U.S. Appl. No. 17/735,349.
Final Office Action dated Nov. 28, 2023 for U.S. Appl. No. 17/735,349.
Notice of Allowance dated Feb. 13, 2024 for U.S. Appl. No. 17/735,349.

* cited by examiner

GATE STRUCTURE IN HIGH-κ METAL GATE TECHNOLOGY

REFERENCE TO RELATED APPLICATIONS

This Application is a Continuation of U.S. application Ser. No. 17/735,349, filed on May 3, 2022, which is a Divisional of U.S. application Ser. No. 16/580,296, filed on Sep. 24, 2019 (now U.S. Pat. No. 11,335,786, issued on May 17, 2022), which claims the benefit of U.S. Provisional Application No. 62/799,939, filed on Feb. 1, 2019. The contents of the above-referenced Patent Applications are hereby incorporated by reference in their entirety.

BACKGROUND

Many modern-day electronic devices contain metal-oxide-semiconductor field-effect transistors (MOSFETs). A MOSFET has a gate structure arranged over a substrate between a source region and a drain region. A voltage applied to a gate electrode of the gate structure determines the conductivity of the MOSFET. High-κ metal gate (HKMG) technology is a promising candidate for next generation MOSFET devices due to advantages with scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
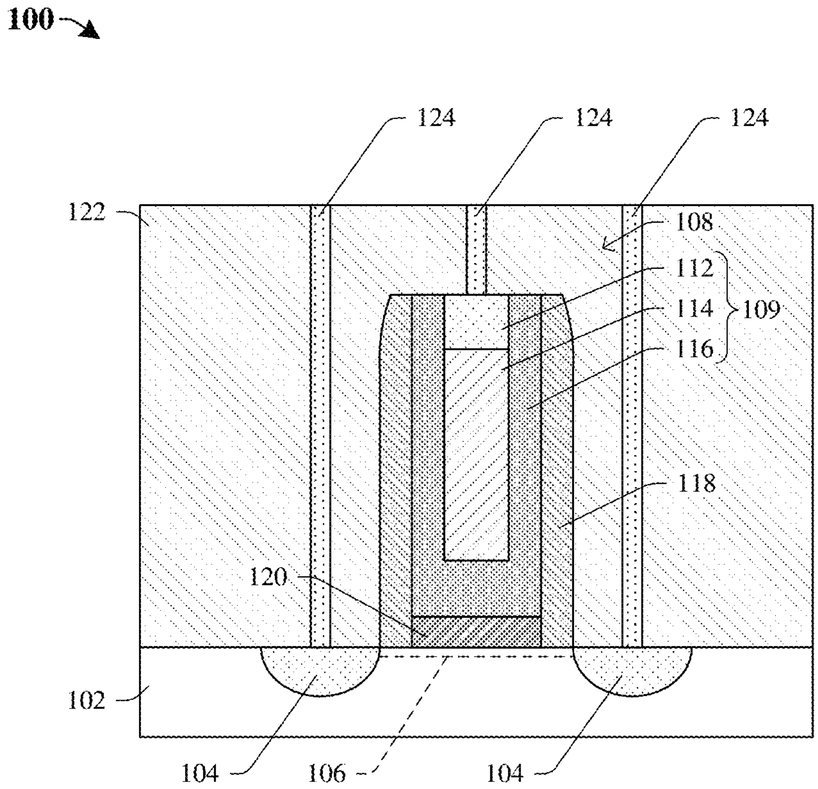
FIG. 1 illustrates a cross-sectional view of some embodiments of a semiconductor device including a work function structure surrounding a silicide layer and overlying a high-κ gate dielectric structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the last two decades, MOSFETs have typically used gate structures comprising polysilicon. In recent years, high-κ metal gate (HKMG) metal-oxide-semiconductor field-effect transistors (MOSFETs) have begun to see widespread use due to improved performance and scaling. In some embodiments, during fabrication of a gate electrode of a HKMG transistor, a dummy gate structure is formed on a substrate and source and drain regions are formed respectively along opposite sidewalls of the dummy gate structure. The dummy gate structure comprises a dummy gate electrode, and further comprises a high-κ gate dielectric layer underlying the dummy gate electrode. An inter-level dielectric (ILD) structure is formed covering the dummy gate structure and a first planarization process (e.g., a chemical mechanical planarization (CMP) process) is performed into the ILD structure until the dummy gate structure is exposed. The dummy gate electrode is removed, thereby exposing the high-κ gate dielectric layer, and a stack of metal layers is formed covering the ILD structure and lining an opening resulting from removal. A second planarization process is performed to remove a portion of the stack of metal layers outside the opening. An etch process is performed to etch back a top surface of the stack of metal layers and to partially clear the opening. A polysilicon layer is formed filling the opening over the stack of metal layers. A third planarization process is performed to remove a portion of the polysilicon layer outside the opening, and a remaining portion of the polysilicon layer is silicided, thereby forming a silicide layer over the stack of metal layers. This, in part, defines the gate electrode of the HKMG transistor. Conductive contacts are disposed over the silicide layer and also over the source and drain regions. Overlying metal wires are subsequently formed within an interconnect dielectric structure over the conductive contacts.

A challenge with the above method is in a complexity of the method, which includes at least three planarization processes and an etch process for the formation of the gate electrode. Further, it has been appreciated that the above structure may present a number of practical difficulties. For example, a thickness and shape of the silicide layer may increase a gate resistance of the HKMG transistor, thereby decreasing a performance of the HKMG transistor. Additionally, in yet another example, the stack of metal layers may limit scaling of the gate electrode, such that scaling of the HKMG transistor may be impeded (e.g., unable to scale a length of the gate electrode to less than about 26 nanometers).

In some embodiments, the present disclosure relates to a method that simplifies the fabrication of the gate electrode of the HKMG transistor by reducing the number of planarization and etch processes used during the fabrication. For example, after removing a dummy gate electrode and defining an opening, a gate electrode of a HKMG transistor may be fabricated by depositing a stack of metal layers and a polysilicon layer in the opening. Removal of the dummy gate electrode comprises performing a first planarization process (e.g., a CMP process). The opening is defined over the high-κ gate dielectric layer and between inner sidewalls of a sidewall spacer. The polysilicon layer covers the stack of metal layers and has a downward protrusion extending into the opening and cupped by the stack of metal layers. A silicide process is performed to partially consume the polysilicon layer and to form a silicide layer with a downward protrusion surrounded by the stack of metal layers. A second planarization process (e.g., a CMP process) is performed into the silicide layer and the stack of metal layers to remove a portion of the silicide layer and a portion of the stack of metal layers outside the opening, thereby defining the gate electrode. Therefore, the disclosed method uses two planarization process to form the gate electrode, thereby reducing fabrication costs of the HKMG transistor.

In further embodiments, the present disclosure relates to an improved structure of the gate electrode of the HKMG transistor that reduces the gate resistance. For example, a T-shaped electrode structure overlies a U-shaped stack of metal layers, such that a lower portion of the T-shaped electrode structure is surrounded by the U-shaped stack of metal layers. Additionally, a thickness of an upper portion of the T-shaped electrode structure is large to reduce gate resistance and increase performance of the HKMG transistor. Further, the large thickness of the upper portion of the T-shaped electrode structure facilitates shrinking the gate electrode (e.g., shrinking a length of the gate electrode to less than about 26 nanometers). This, in part, increases an ability to scale the HKMG transistor and/or increases a number of HKMG transistors disposed on a single silicon wafer.

With reference to FIG. 1, a cross-sectional view of some embodiments of a semiconductor device 100 including a transistor 108 with a gate structure 109.

The transistor 108 overlies a substrate 102 and comprises the gate structure 109, a high-κ gate dielectric structure 120, a sidewall spacer 118, and source/drain regions 104. The gate structure 109 overlies the high-κ gate dielectric structure 120. The sidewall spacer 118 surrounds the gate structure 109 and the high-κ gate dielectric structure 120. The source/drain regions 104 are disposed within the substrate 102 on opposite sides of the transistor 108. A selectively-conductive channel 106 is in the substrate 102, laterally between the source/drain regions 104. In some embodiments, the source/drain regions 104 and the selectively-conductive channel 106 are doped regions of the substrate 102 having opposite doping types. For example, the selectively-conductive channel 106 may be p-type and the source/drain regions 104 may be n-type, or vice versa. In some embodiments, the transistor 108 may be configured as a high-κ metal gate (HKMG) metal-oxide-semiconductor field-effect transistor (MOSFET).

An inter-level dielectric (ILD) structure 122 overlies the transistor 108. A plurality of conductive vias 124 extend through the ILD structure 122. The conductive vias 124 overlie the gate structure 109 and the source/drain regions 104. The high-κ gate dielectric structure 120 includes one or more dielectric layer(s) with one or more high-κ dielectric material(s). As used herein, a high-κ dielectric material is a dielectric material with a dielectric constant greater than 3.9. The gate structure 109 includes a silicide layer 112, a gate body layer 114 underlying the silicide layer 112, and a work function structure 116 (in some embodiments, referred to as a stack of metal layers) wrapped around the silicide layer 112 and the gate body layer 114. In some embodiments, the gate body layer 114 is a polysilicon layer. The work function structure 116 may, for example, comprise one or more metal layer(s).

In some embodiments, outer sidewalls of the silicide layer 112 and outer sidewalls of the gate body layer 114 are aligned. Additionally, the outer sidewalls of the silicide layer 112 and the outer sidewalls of the gate body layer 114 are in direct contact with inner sidewalls of the work function structure 116. A top surface of the silicide layer 112 and a top surface of the work function structure 116 are substantially aligned.

By wrapping the work function structure 116 around outer sidewalls of the silicide layer 112 and aligning the top surface of the silicide layer 112 with the top surface of the work function structure 116, fabrication of the transistor 108 may be simplified. For example, formation of the silicide layer 112 and formation of the work function structure 116 may comprise a single planarization process (e.g., a single chemical mechanical planarization (CMP) process). By simplifying the fabrication of the transistor 108, cost and time associated with formation of the semiconductor device 100 may be reduced.

Figure 2:
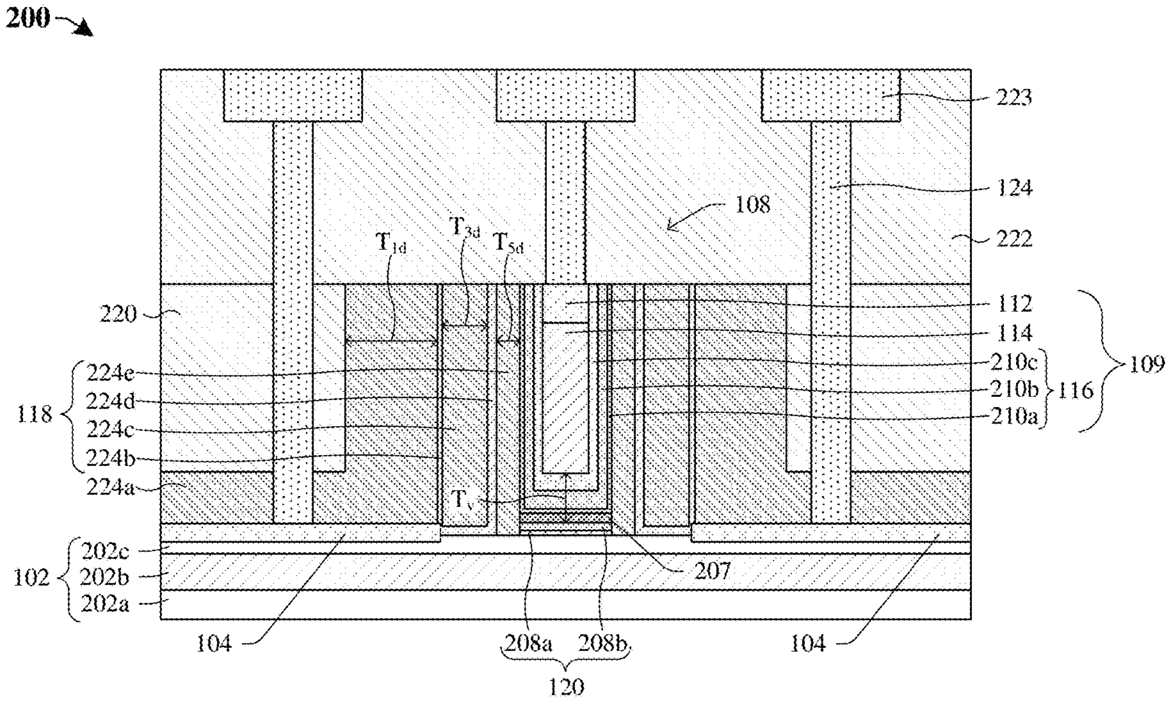
FIG. 2 illustrates a cross-sectional view of some more detailed embodiments of the semiconductor device of FIG. 1 in which the work function structure comprises a stack of metal layers and the high-κ gate dielectric structure comprises a stack of dielectric layers.

With reference to FIG. 2, a cross-sectional view of a semiconductor device 200 according to some alternative embodiments of the semiconductor device 100 of FIG. 1 is provided. The high-κ gate dielectric structure 120 comprises a stack of dielectric layers 208*a-b* and the work function structure 116 comprises a stack of metal layers 210*a-c*.

In some embodiments, the substrate 102 may, for example, have a first doping type (e.g., p-type). In some embodiments, the substrate 102 may, for example, be a bulk substrate (e.g., a bulk silicon substrate), a silicon-on-insulator (SOI) substrate, or some other suitable substrate. For example, the substrate 102 may comprise a device layer 202*c*, an insulator layer 202*b* underlying the device layer 202*c*, and a handle substrate 202*a* underlying the insulator layer 202*b*. In the aforementioned example, the substrate 102 is configured as an SOI substrate. The device layer 202*c* may, for example, be or comprise silicon, such as, for example, monocrystalline silicon, amorphous silicon, bulk silicon, or the like. Further, the device layer 202*c* may, for example, have the first doping type. The insulator layer 202*b* may, for example, be an oxide, such as silicon oxide. The handle substrate 202*a* may, for example, be or comprise silicon, such as monocrystalline silicon, amorphous silicon, bulk silicon, or the like.

The source/drain regions 104 are epitaxial layers overlying the substrate 102. The source/drain regions 104 have a second doping type (e.g., n-type) opposite the first doping type. The source/drain regions 104 have a top surface disposed above a top surface of the substrate 102 and have a bottom surface disposed below the top surface of the substrate 102. In some embodiments, the source/drain regions 104 may be ion implanted regions of the device layer 202*c* comprising the second doping type. In further embodiments, a silicide layer (not shown) may be disposed between the source/drain regions 104 and the overlying conductive vias 124. In yet further embodiments, lightly doped regions (e.g., having a doping concentration less than the source/drain regions) (not shown) are disposed laterally between the high-κ gate dielectric structure 120 and respectively the source/drain regions 104. The lightly doped regions may, for example, be epitaxial layers and/or discrete doped regions of the device layer 202*c* comprising the second doping type. In some embodiments, isolation structures may be disposed in the substrate 102 at outermost regions of the source/drain regions 104 to electrically isolate the transistor 108 from adjacent devices on the substrate 102 (not shown).

The high-κ gate dielectric structure 120 comprises the stack of dielectric layers 208*a-b*. The stack of dielectric layers 208*a-b* may respectively, for example, be or comprise a high-κ dielectric material, such as silicon oxynitride, hafnium oxide, hafnium oxynitride, hafnium aluminum oxide, zirconium oxide, or the like. As used herein, a high-κ dielectric material is a dielectric material with a dielectric constant greater than 3.9. In some embodiments, the stack of dielectric layers 208*a-b* may respectively be or comprise dielectric materials different from one another. In some embodiments, a first gate dielectric layer 208*a* overlies the substrate 102 and a second gate dielectric layer 208*b* overlies the first gate dielectric layer 208*a*.

The work function structure 116 comprises the stack of metal layers 210*a-c*. The stack of metal layers 210*a-c* may respectively, for example, be or comprise a metal material, such as titanium, titanium nitride, titanium aluminum, or the like. In some embodiments, the stack of metal layers 210*a-c* may respectively be or comprise metal materials different from one another. For example, a first metal layer 210*a* may be or comprise titanium, a second metal layer 210*b* may be or comprise titanium nitride, and/or a third metal layer 210*c* may be or comprise titanium aluminum. The work function structure 116 has a vertical thickness $T_v$ defined between a top surface of the high-κ gate dielectric structure 120 and a bottom surface of the gate body layer 114. In some embodiments, the vertical thickness $T_v$ may be within a range of approximately 4 to 40 nanometers. In some embodiments, if the vertical thickness $T_v$ is greater than 4 nanometers, then a resistance of the gate structure 109 may be reduced while maintaining a structural integrity of the gate structure 109. In further embodiments, if the vertical thickness $T_v$ is less than 40 nanometers, then the resistance of the gate structure 109 may be reduced while reducing costs associated with formation of the work function structure 116. In further embodiments, an intermediate metal layer 207 is disposed between the work function structure 116 and the high-κ gate dielectric structure 120. In some embodiments, the intermediate metal layer 207 is a part of the work function structure 116. In such embodiments, the intermediate metal layer 207 may, for example, be or comprise a metal material, such as titanium, titanium nitride, titanium aluminum, or the like and/or have a thickness within a range of 1 to 10 nanometers. In some embodiments, the reduced resistance of the gate structure 109 may, for example, reduce substrate and/or radio frequency (RF) losses.

In some embodiments in which the source/drain regions 104 are n-type, the gate body layer 114 is n-type polysilicon, the work function structure 116 comprises metal(s) with n-type work function(s), or some other suitable conductive material with an n-type work function. As used herein, a metal with an n-type work function may be or comprise, for example, hafnium, zirconium, titanium, tantalum, aluminum, some other suitable n-type work function metal(s), or any combination of the foregoing. In some embodiments in which the source/drain regions 104 are p-type, the gate body layer 114 is p-type polysilicon, the work function structure 116 comprises metal(s) with p-type work function(s), or some other suitable conductive material with an p-type work function. As used herein, a metal with a p-type work function may be, for example, ruthenium, palladium, platinum, cobalt, nickel, titanium aluminum nitride, tungsten carbon nitride, some other suitable p-type work function metal(s), or any combination of the foregoing.

In some embodiments, the stack of metal layers 210*a-c* respectively may have thickness different from one another. For example, the first metal layer 210*a* may have a thickness less than a thickness of the second metal layer 210*b*. The third metal layer 210*c* may have a thickness less than the thickness of the second metal layer 210*b* and greater than the thickness of the first metal layer 210*a*. Each metal layer in the stack of metal layers 210*a-c* may respectively have a thickness within a range of about 1 to 10 nanometers. The work function structure 116 has a U-shape, such that each metal layer 210*a-c* respectively has a U-shape. In yet further embodiments, the intermediate metal layer 207 may have a thickness less than the third metal layer 210*c*.

The gate body layer 114 is disposed within a center of the U-shaped work function structure 116. Thus, the work function structure 116 wraps around sidewalls of the gate body layer 114 and cups an underside of the gate body layer 114. The gate body layer 114 may, for example, be or comprise polysilicon. In the aforementioned example, the polysilicon may be doped such that the gate body layer 114 forms an ohmic contact with the work function structure 116 and the silicide layer 112. For example, the gate body layer 114 may comprise the second doping type (e.g., n-type) with a doping concentration greater than $1*10^{19}$ atoms/$cm^3$. The doped polysilicon may, for example, decrease a gate resistance of the gate structure 109, thereby decreasing a power consumption of the transistor 108. In further embodiments, the gate body layer 114 may, for example, be or comprise intrinsic (i.e., undoped) polysilicon. The silicide layer 112 may, for example, be or comprise nickel silicide, cobalt silicide, titanium silicide, copper silicide, or the like. In some embodiments, a thickness of the gate body layer 114 may be four times or greater than a thickness of the silicide layer 112. The silicide layer 112 is configured to electrically couple an overlying conductive via 124 to the work function structure 116. In some embodiments, outer sidewalls of the silicide layer 112 are aligned with outer sidewalls of the gate body layer 114. In some embodiments, the thickness of the silicide layer 112 is less than the vertical thickness $T_v$.

The sidewall spacer 118 comprises a plurality of spacer dielectric layers 224*b-e*. A contact etch stop layer (CESL) 224*a* surrounds a first spacer dielectric spacer layer 224*b*. In some embodiments, the CESL 224*a*, a second spacer dielectric layer 224*c*, and a fourth spacer dielectric layer 224*e* may respectively be or comprise a same dielectric material. The same dielectric material may, for example, be or comprise silicon nitride, silicon carbide, or the like. The CESL 224*a* has a first dielectric thickness $T_{1d}$ within a range of about 10 to 20 nanometers. The second spacer dielectric layer 224*c* has a third dielectric thickness $T_{3d}$ within a range of about 10 to 30 nanometers. The fourth spacer dielectric layer 224*e* has a fifth dielectric thickness $T_{5d}$ within a range of about 3 to 5 nanometers. In some embodiments, the first spacer dielectric layer 224*b* and a third spacer dielectric layer 224*d* may respectively be or comprise another same dielectric material. The another same dielectric material may, for example, be or comprise an oxide such as silicon oxide, or the like. In further embodiments, the first and third spacer dielectric layers 224*b*, 224*d* are a single continuous dielectric layer having a U-shape. The single continuous dielectric layer may wrap around sidewalls of the second spacer dielectric layer 224*c* and cup an underside of the second spacer dielectric layer 224*c*.

A first ILD layer 220 overlies the CESL 224*a*. A second ILD layer 222 overlies the transistor 108 and the first ILD layer 220. The conductive vias 124 extend from conductive wires 223 through the second ILD layer 222 to electrically couple the silicide layer 112 and the source/drain regions 104 to overlying metal layers (e.g., conductive layers in an overlying interconnect structure) and/or other semiconductor devices (e.g., a memory cell) (not shown). In some embodiments, the first and second ILD layers 220, 222 may, for example, respectively be or comprise a low-κ dielectric material, silicon oxide, or the like. As used herein, a low-κ dielectric material is a dielectric material with a dielectric constant less than 3.9. The conductive vias 124 may, for example, respectively be or comprise aluminum, copper, or the like. The conductive wires 223 may, for example, respectively be or comprise aluminum copper, or the like.

Figure 3A:
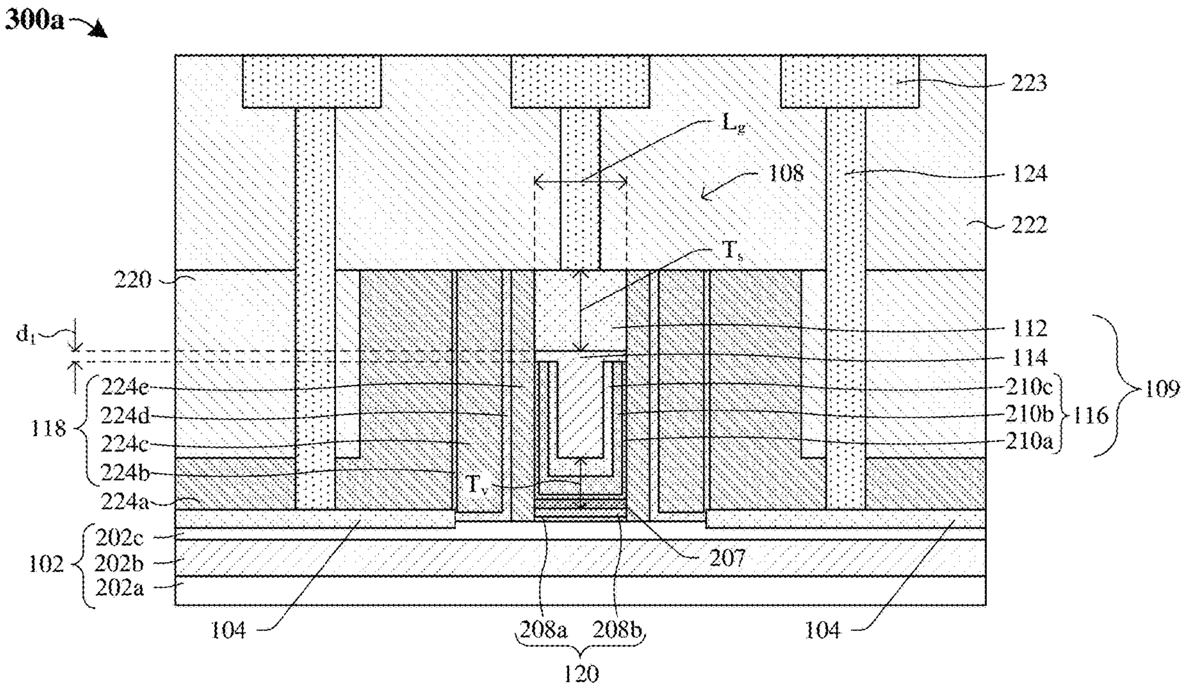
FIGS. 3A-3C illustrate various cross-sectional views of some alternative embodiments of the semiconductor device of FIG. 2.

With reference to FIG. 3A, a cross-sectional view of a semiconductor device 300*a* according to some alternative embodiments of the semiconductor device 200 of FIG. 2 is provided, in which the gate body layer 114 has a T-shape.

The gate body layer 114 has a T-shape such that a top surface of the gate body layer 114 is vertically above the top surface of the work function structure 116 by a distance $d_1$. In some embodiments, the distance $d_1$ may be within a range of about 1 to 10 nanometers. Thus, the work function structure 116 wraps around outer sidewalls of the gate body layer 114 and cups an underside of the gate body layer 114. An upper portion of the gate body layer 114 overhands the work function structure 116. Outer sidewalls of the silicide layer 112 are aligned with the outer sidewalls of the work function structure 116. A thickness $T_s$ of the silicide layer 112 is greater than the thickness $T_v$ of the work function structure 116.

In some embodiments, the thickness $T_s$ of the silicide layer 112 is within a range of about 5 to 30 nanometers. In some embodiments, if the thickness $T_s$ is greater than 5 nanometers, then a gate resistance of the gate structure 109 is reduced. In further embodiments, if the thickness $T_s$ is less than 30 nanometers then the gate resistance of the gate structure 109 is reduced while mitigating damage to a structure of the semiconductor device 300*a* during a silicide process used to form the silicide layer 112. Aligning outer sidewalls of the silicide layer 112 with outer sidewalls of the work function structure 116 facilitates reduction of a length $L_g$ of the gate structure 109. By virtue of the profile of the silicide layer 112, the length $L_g$ may be reduced to less than 26 nanometers, thereby increasing an ability to scale the transistor 108 and/or increases a number of transistors 108 disposed on a single silicon wafer.

Figure 3B:
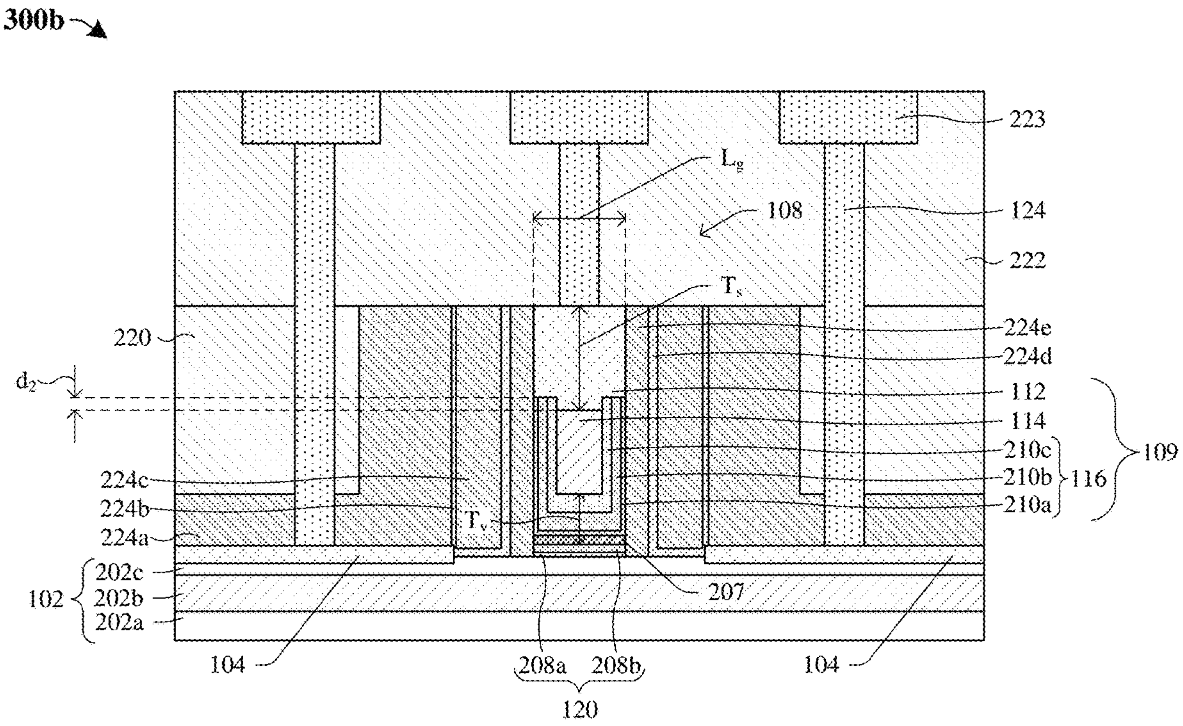

With reference to FIG. 3B, a cross-sectional view of a semiconductor device 300*b* according to some alternative embodiments of the semiconductor device 200 of FIG. 2 is provided. A bottom surface of the silicide layer 112 is below a top surface of the work function structure 116 by a distance $d_2$. In some embodiments, the distance $d_2$ may be within a range of about 1 to 10 nanometers. The silicide layer 112 has a T-shape. Thus, the work function structure 116 wraps around outer sidewalls of a protrusion of the silicide layer 112.

Figure 3C:
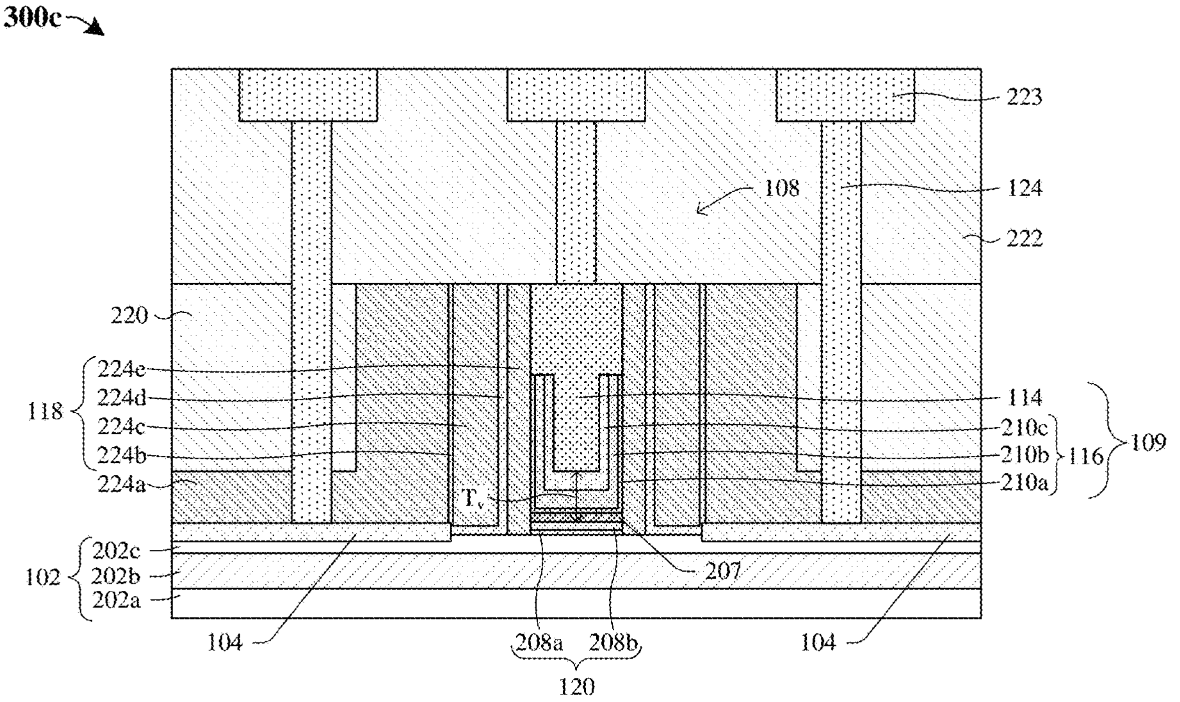

With reference to FIG. 3C, a cross-sectional view of a semiconductor device 300*c* according to some alternative embodiments of the semiconductor device 200 of FIG. 2 is provided. The gate body layer 114 extends from an upper surface of the sidewall spacer 118 to an upper surface of the work function structure 116. The gate body layer 114 has a top surface that is vertically offset from a top surface of the work function structure 116 and further has a downward protrusion cupped by the work function structure 116. In some embodiments, the gate body layer 114 is a single material. The single material may, for example, be or comprise aluminum or some other suitable material.

FIGS. 4-9 illustrate cross-sectional views 400-900 of some embodiments of a first method of forming a semiconductor device including a high-κ metal gate (HKMG) structure with a silicide layer according to aspects of the present disclosure. Although the cross-sectional views 400-900 shown in FIGS. 4-9 are described with reference to a method, it will be appreciated that the structures shown in FIGS. 4-9 are not limited to the method but rather may stand alone separate of the method. Furthermore, although FIGS. 4-9 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 4-9 may, for example, be employed to form the semiconductor device 200 of FIG. 2.

Figure 4:
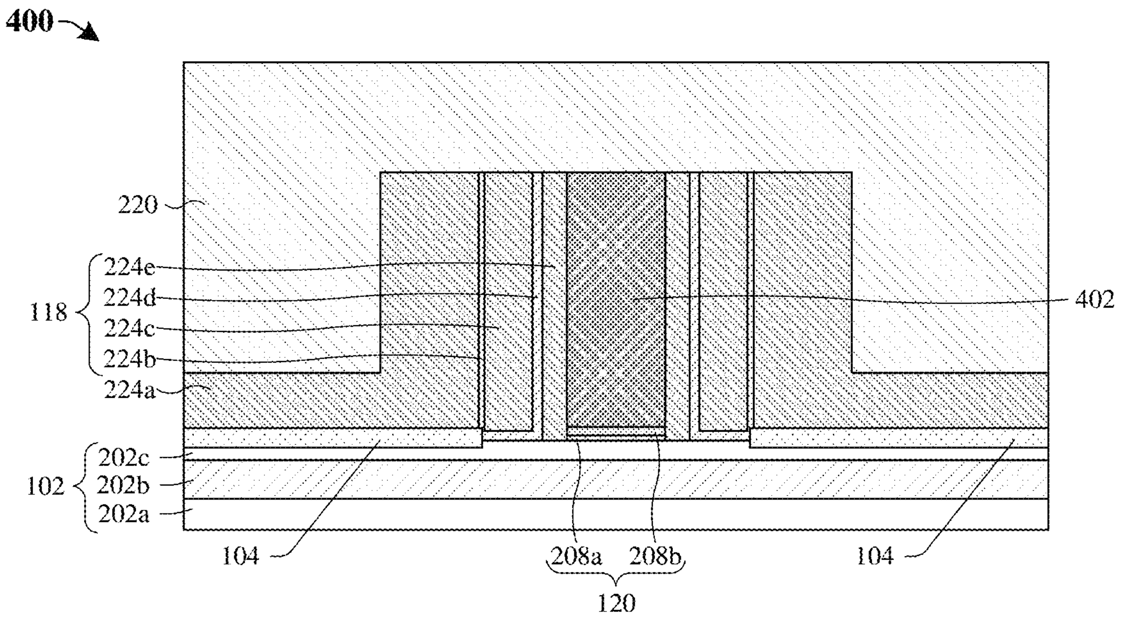
FIGS. 4-9 illustrate cross-sectional views of various embodiments of a first method of forming a semiconductor device including a work function structure surrounding a silicide layer and overlying a high-κ gate dielectric structure.

As shown in cross-sectional view 400 of FIG. 4, a dummy gate electrode structure 402 overlying a substrate 102 is provided. In some embodiments, a method for forming the structure of FIG. 4 may comprise forming the high-κ gate dielectric structure 120 over the substrate 102. The dummy gate electrode structure 402 is formed over the high-κ gate dielectric structure 120. After forming the dummy gate electrode structure 402, the source/drain regions 104 may be epitaxially formed over the substrate 102. In alternative embodiments, the source/drain regions 104 may be formed in the substrate 102 by a doping process. The sidewall spacer 118 may be formed around the dummy gate electrode structure 402 and the high-κ gate dielectric structure 120. The contact etch stop layer (CESL) 224*a* may be formed around the sidewall spacer 118. The first inter-level dielectric (ILD) layer 220 is formed over the sidewall spacer 118, the dummy gate electrode structure 402, and the CESL 224*a*.

Figure 5:
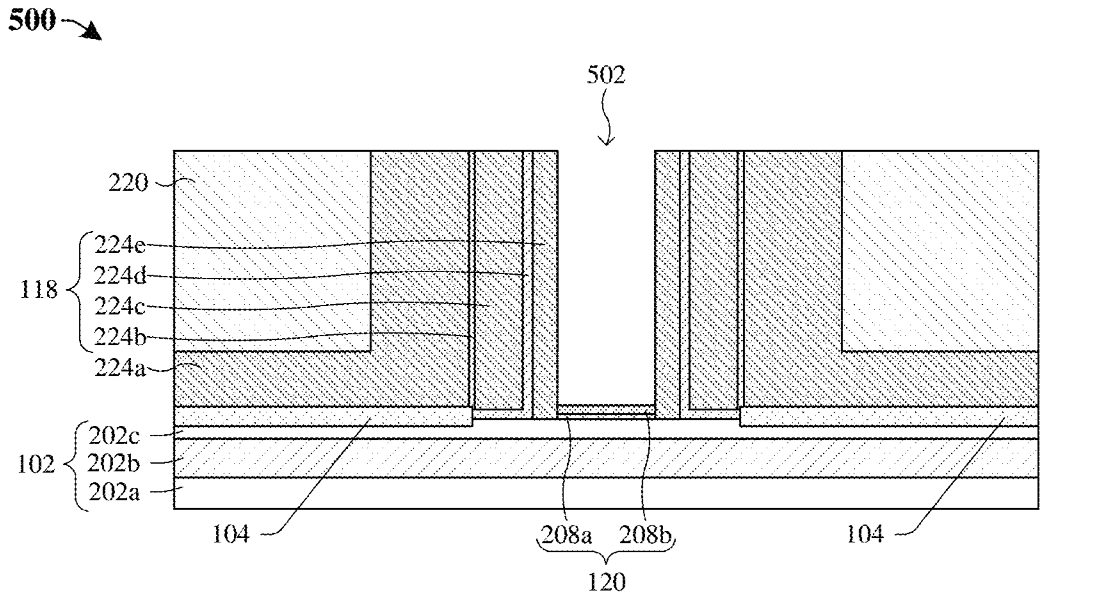

As shown in cross-sectional view 500 of FIG. 5, the dummy gate electrode structure (402 of FIG. 4) is removed, thereby defining an opening 502 above the high-κ gate dielectric structure 120. In some embodiments, before removing the dummy gate electrode structure (402 of FIG. 4), a planarization process (e.g., a chemical mechanical planarization (CMP) process) is performed into the first ILD layer 220. The planarization process is performed until an upper surface of the sidewall spacer 118 and an upper surface of the dummy gate electrode structure (402 of FIG. 4) are exposed. The dummy gate electrode structure (402 of FIG. 4) may be removed by: forming a masking layer (not shown) over the structure of FIG. 4, performing an etch process according to the masking layer, thus defining the opening 502, and subsequently removing the masking layer.

Figure 6:
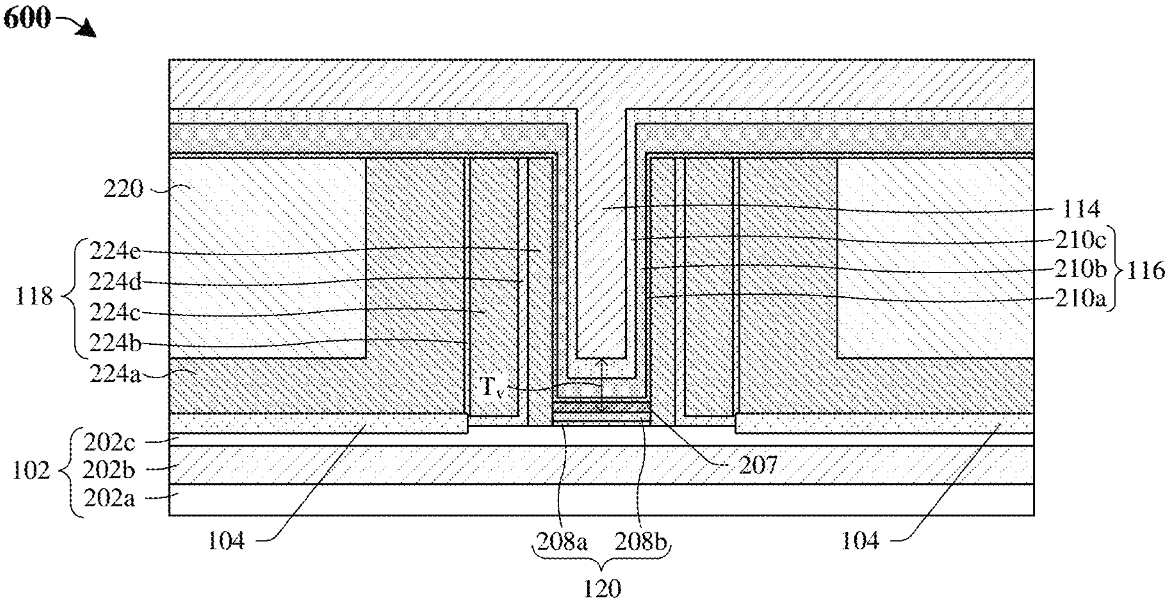

As shown in cross-sectional view 600 of FIG. 6, a work function structure 116, an intermediate metal layer 207, and a gate body layer 114 are formed over the structure of FIG. 5. The work function structure 116 lines the opening (502 of FIG. 5). The gate body layer 114 comprises a protrusion protruding into the opening (502 of FIG. 5) and cupped by the work function structure 116. The work function structure 116 and the intermediate metal layer 207 have a vertical thickness $T_v$ defined between a top surface of the high-κ gate dielectric structure 120 and a bottom surface of the gate body layer 114. In some embodiments the vertical thickness $T_v$ may be within a range of approximately 4 to 40 nanometers. In some embodiments, the gate body layer 114 may, for example, be or comprise a single material such as polysilicon. In the aforementioned embodiment, the polysilicon may be doped with a second doping type (e.g., n-type). In some embodiments, an ion implantation process may be performed on the gate body layer 114 to implant the second doping type into the polysilicon.

Figure 7:
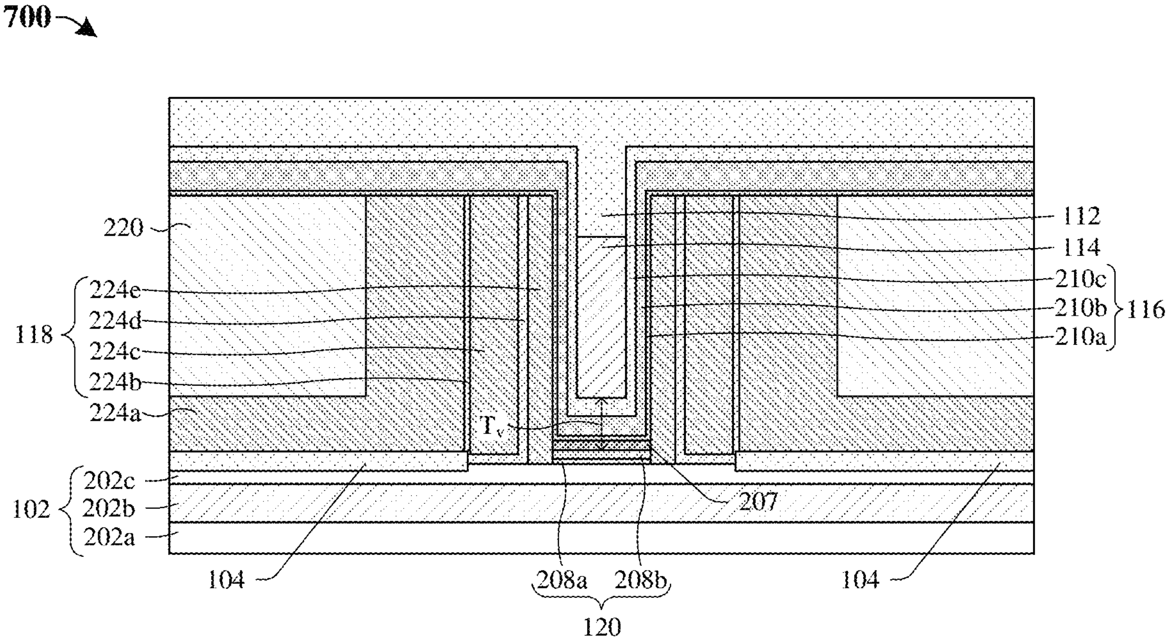

As shown in cross-sectional view 700 of FIG. 7, a silicide process is performed to convert a portion of the gate body layer 114 into a silicide layer 112. In some embodiments, the silicide process includes forming a conductive layer (not shown) over the structure of FIG. 6, and subsequently performing an annealing process to convert the conductive layer and the portion of the gate body layer 114 into the silicide layer 112. A bottom surface of the silicide layer 112 extends below a top surface of the sidewall spacer 118.

Figure 8:
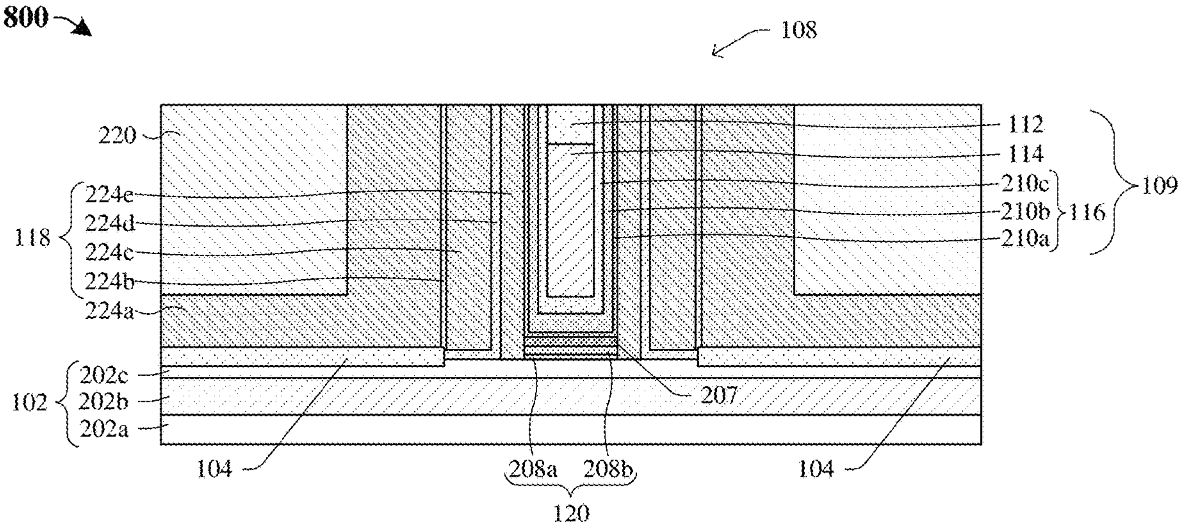

As shown in cross-sectional view 800 of FIG. 8, a planarization process (e.g., a CMP process) is performed into the structure of FIG. 7 until the upper surface of the sidewall spacer 118 is reached. This, in part, defines a gate structure 109 over the high-κ gate dielectric structure 120 and further, in part, defines a transistor 108 comprising the gate structure 109. Therefore, in some embodiments, the transistor 108 may be formed by using two planarization processes. This, in part, reduces fabrication cost and time associated with forming the transistor 108.

Figure 9:
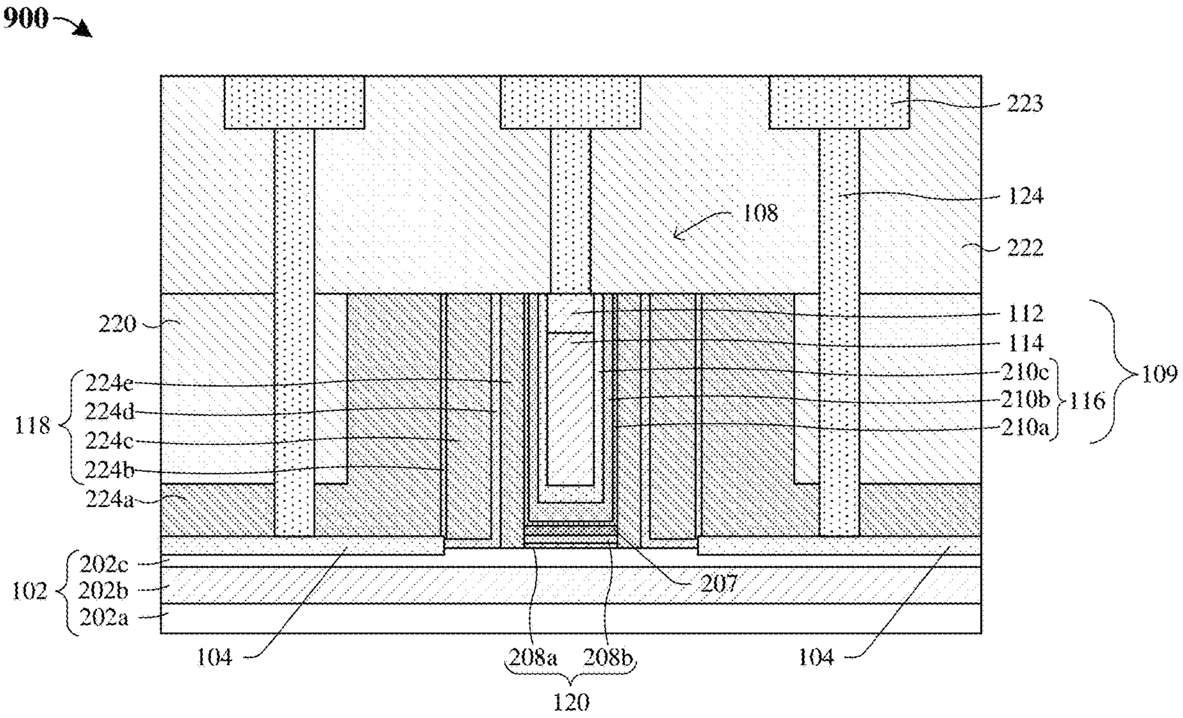

As shown in cross-sectional view 900 of FIG. 9, a second ILD layer 222 is formed over the first ILD layer 220. Conductive vias 124 and conductive wires 223 are formed over the source/drain regions 104 and the silicide layer 112.

Figure 10:
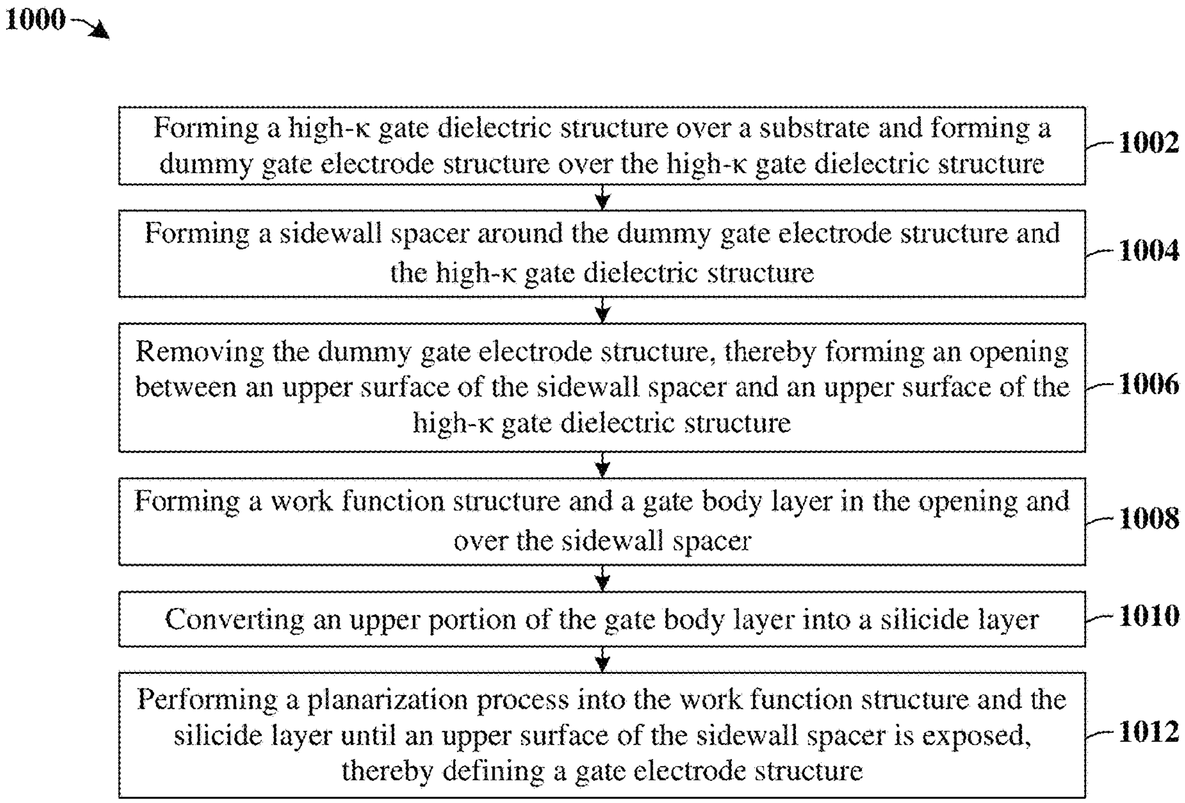
FIG. 10 illustrates a methodology in flowchart format that illustrates some embodiments of the first method of forming the semiconductor device including a work function structure surrounding a silicide layer and overlying a high-κ gate dielectric structure.

FIG. 10 illustrates a method 1000 of forming a semiconductor device including a high-κ metal gate (HKMG) structure with a silicide layer according to the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. In some embodiments, the method 1000 relates to the first method of FIGS. 4-9.

At act 1002, a high-κ gate dielectric structure is formed over a substrate and a dummy gate electrode structure is formed over the high-κ gate dielectric structure. FIG. 4 illustrates a cross-sectional view 400 corresponding to some embodiments of act 1002.

At act 1004, a sidewall spacer is formed around the dummy gate electrode structure and the high-κ gate dielectric structure. FIG. 4 illustrates a cross-sectional view 400 corresponding to some embodiments of act 1004.

At act 1006, the dummy gate electrode structure is removed, thereby forming an opening between an upper surface of the sidewall spacer and an upper surface of the high-κ gate dielectric structure. FIG. 5 illustrates a cross-sectional view 500 corresponding to some embodiments of act 1006.

At act 1008, a work function structure and a gate body layer are formed in the opening and over the sidewall spacer. FIG. 6 illustrates a cross-sectional view 600 corresponding to some embodiments of act 1008.

At act 1010, an upper portion of the gate body layer is converted into a silicide layer. FIG. 7 illustrates a cross-sectional view 700 corresponding to some embodiments of act 1010.

At act 1012, a planarization process is performed into the work function structure and the silicide layer until an upper surface of the sidewall spacer is exposed, thereby defining a gate electrode structure. FIG. 8 illustrates a cross-sectional view 800 corresponding to some embodiments of act 1012.

FIGS. 11-18 illustrate cross-sectional views 1100-1800 of some embodiments of a second method of forming a semiconductor device including a high-κ metal gate (HKMG) structure according to aspects of the present disclosure. Although the cross-sectional views 1100-1800 shown in FIGS. 11-18 are described with reference to a method, it will be appreciated that the structures shown in FIGS. 11-18 are not limited to the method but rather may stand alone separate of the method. Furthermore, although FIGS. 11-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 11-18 may, for example, be employed to form the semiconductor device 300*a* of FIG. 3A.

Figure 11:
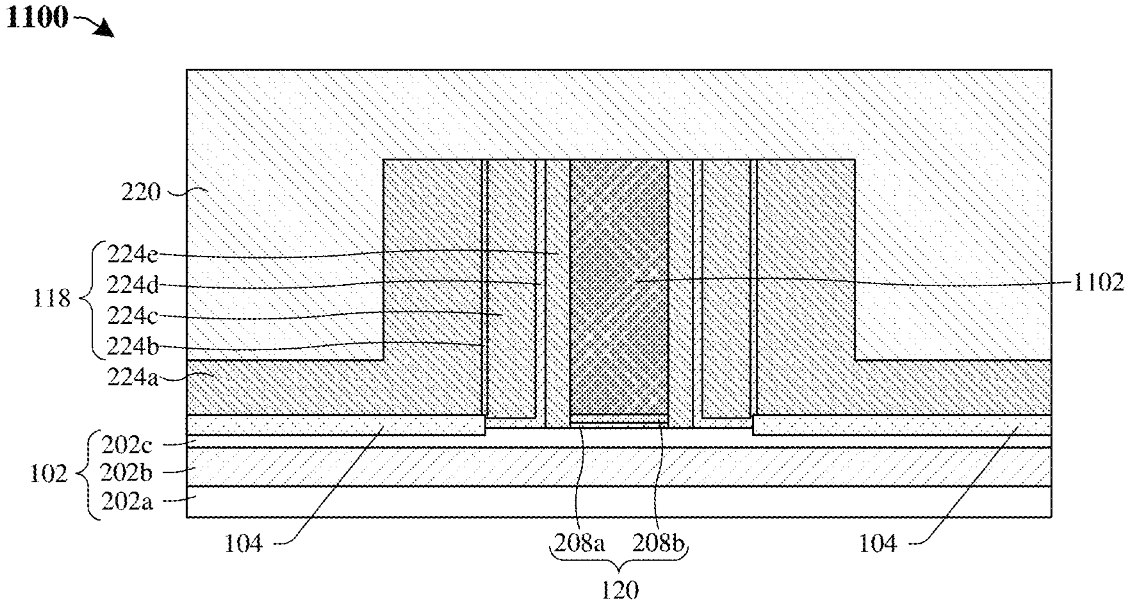
FIGS. 11-18 illustrate cross-sectional views of various embodiments of a second method of forming a semiconductor device including a gate structure overlying a high-κ gate dielectric structure.

As shown in cross-sectional view 1100 of FIG. 11, a dummy gate electrode structure 1102 overlying a substrate 102 is provided. In some embodiments, a method for forming the structure of FIG. 11 may comprise forming the high-κ gate dielectric structure 120 over the substrate 102. The dummy gate electrode structure 1102 is formed over the high-κ gate dielectric structure 120. After forming the dummy gate electrode structure 1102, the source/drain regions 104 may be epitaxially formed over the substrate 102. In alternative embodiments, the source/drain regions 104 may be formed in the substrate 102 by a doping process. The sidewall spacer 118 may be formed around the dummy gate electrode structure 1102 and the high-κ gate dielectric structure 120. The contact etch stop layer (CESL) 224*a* may be formed around the sidewall spacer 118. The first inter-level dielectric (ILD) layer 220 is formed over the sidewall spacer 118, the dummy gate electrode structure 1102, and the CESL 224*a*.

Figure 12:
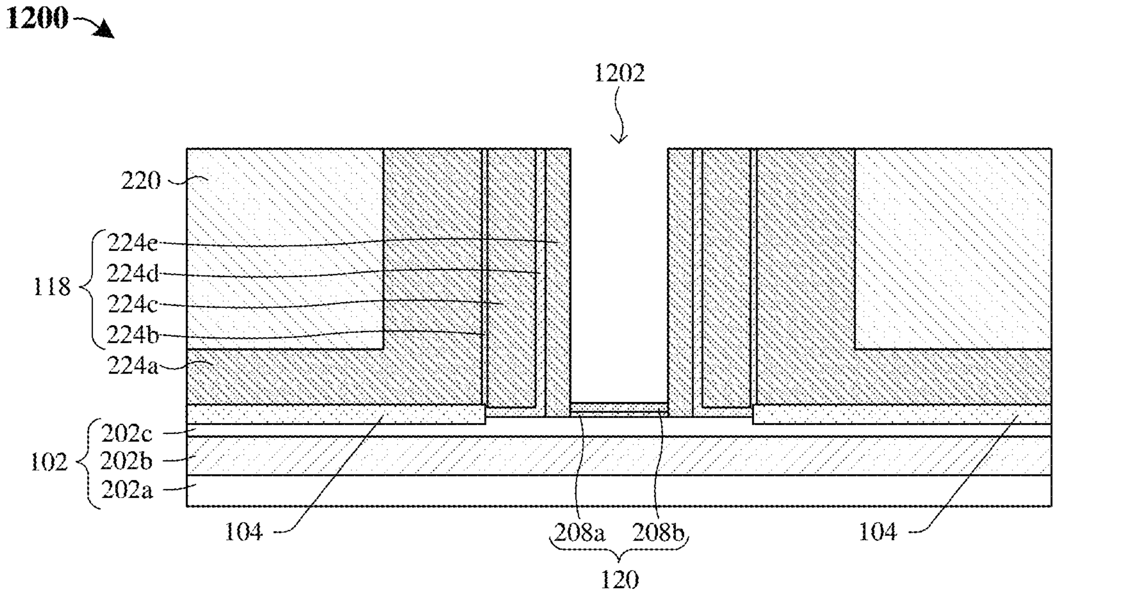

As shown in cross-sectional view 1200 of FIG. 12, the dummy gate electrode structure (1102 of FIG. 11) is removed, thereby defining a first opening 1202 above the high-κ gate dielectric structure 120. In some embodiments, before removing the dummy gate electrode structure (1102 of FIG. 11), a planarization process (e.g., a CMP process) is performed into the first ILD layer 220. The planarization process is performed until an upper surface of the sidewall spacer 118 and an upper surface of the dummy gate electrode structure (1102 of FIG. 11) are exposed. The dummy gate electrode structure (1102 of FIG. 11) may be removed by: forming a masking layer (not shown) over the structure of FIG. 11, performing an etch process according to the masking layer, thus defining the first opening 1202, and subsequently removing the masking layer.

Figure 13:
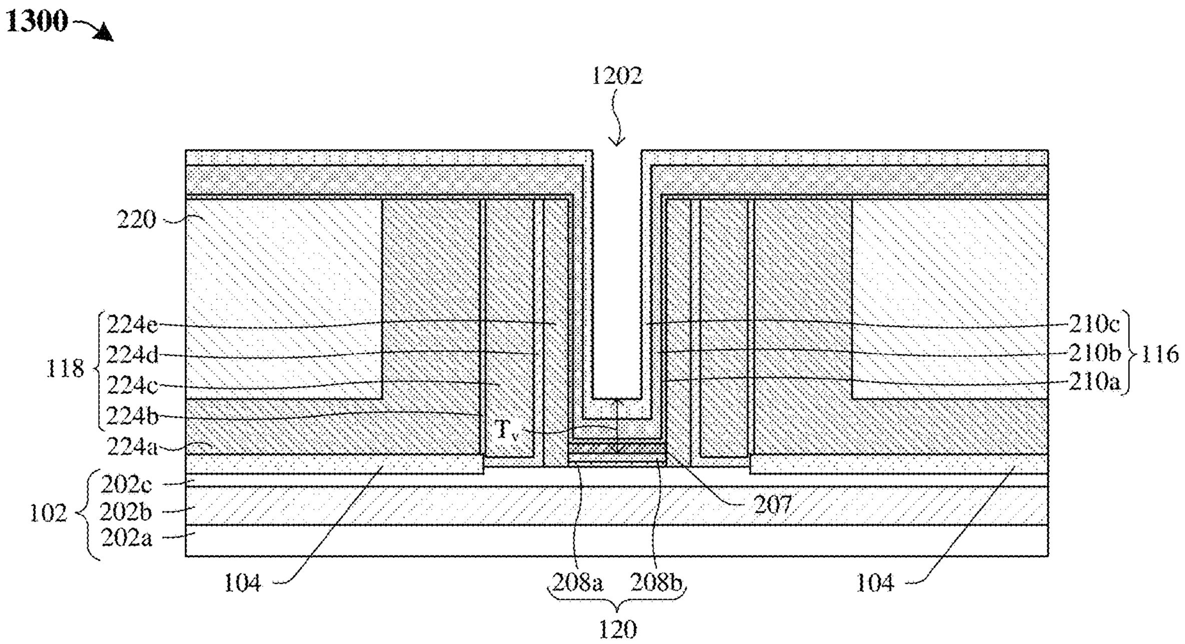

As shown in cross-sectional view 1300 of FIG. 13, a work function structure 116 and an intermediate metal layer 207 are formed over the structure of FIG. 12. The work function structure 116 lines a portion the first opening 1202 and directly contacts inner sidewalls of the sidewall spacer 118. The work function structure 116 and the intermediate metal layer 207 have a vertical thickness $T_v$ defined between a top surface of the high-κ gate dielectric structure 120 and an upper surface of the work function structure 116. In some embodiments the vertical thickness $T_v$ may be within a range of approximately 4 to 40 nanometers.

Figure 14:
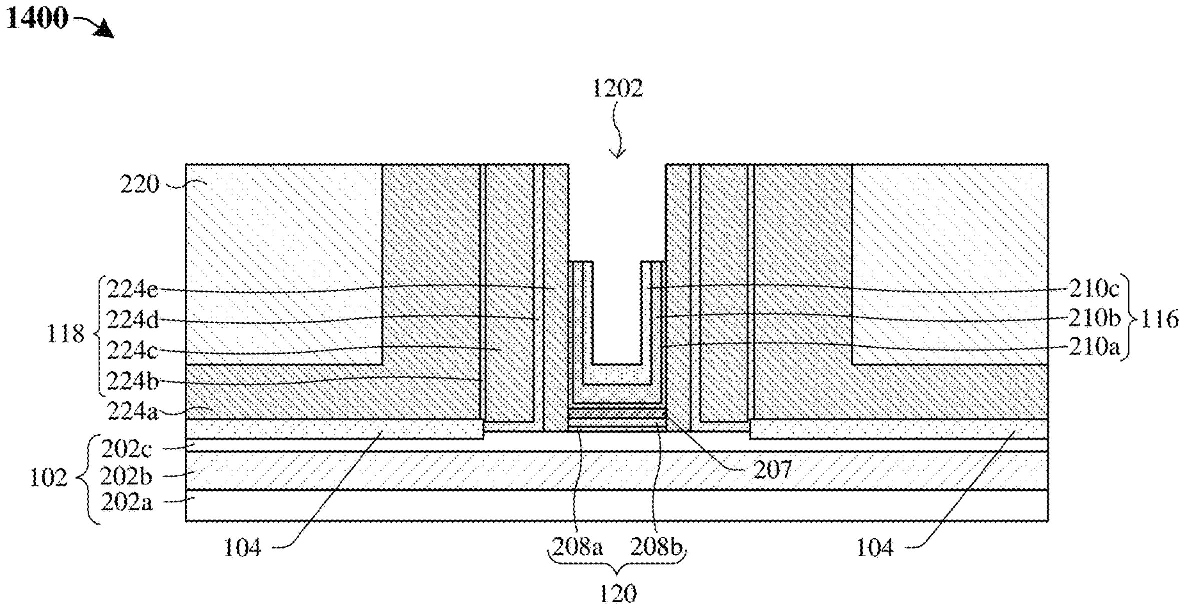

As shown in cross-sectional view 1400 of FIG. 14, an etching process is performed on the work function structure 116, thereby exposing a portion of the inner sidewalls of the sidewall spacer 118. A top surface of the work function structure 116 is disposed below the upper surface of the sidewall spacer 118.

Figure 15:
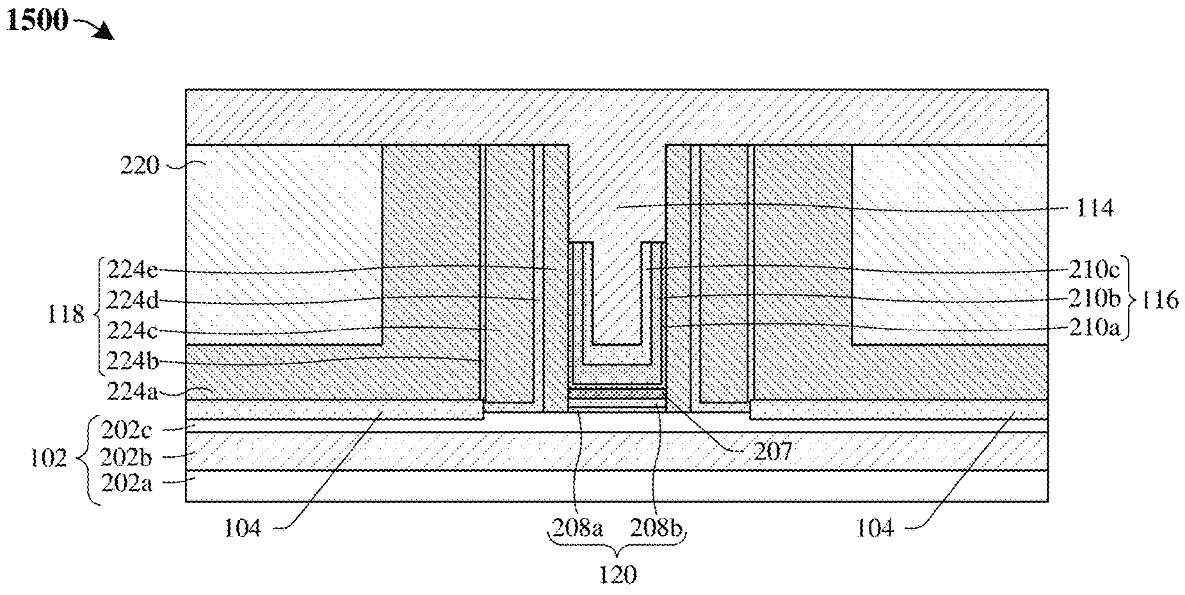

As shown in cross-sectional view 1500 of FIG. 15, a gate body layer 114 is formed over the sidewall spacer 118 and the work function structure 116, thereby filling the first opening (1202 of FIG. 12). In some embodiments, the gate body layer 114 may, for example, be or comprise a single material such as polysilicon. In the aforementioned embodiment, the polysilicon may be doped with a second doping type (e.g., n-type). In some embodiments, an ion implantation process may be performed on the gate body layer 114 to implant the second doping type into the polysilicon.

Figure 16:
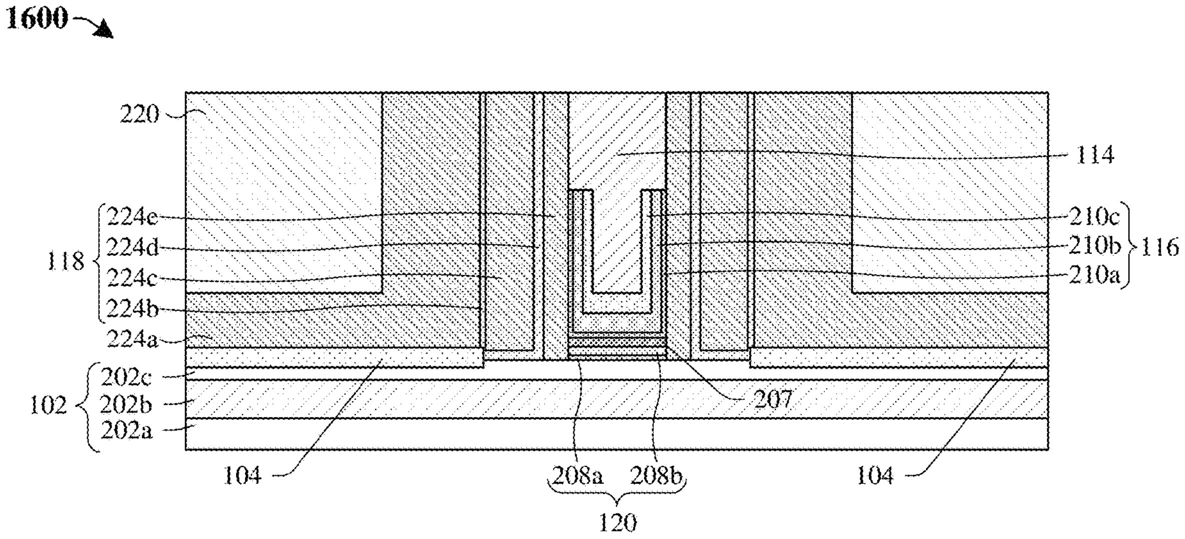

As shown in cross-sectional view 1600 of FIG. 16, a planarization process (e.g., a CMP process) is performed on the structure of FIG. 15. In some embodiments, the planarization process is performed into the gate body layer 114 until the upper surface of the sidewall spacer 118 is exposed.

Figure 17:
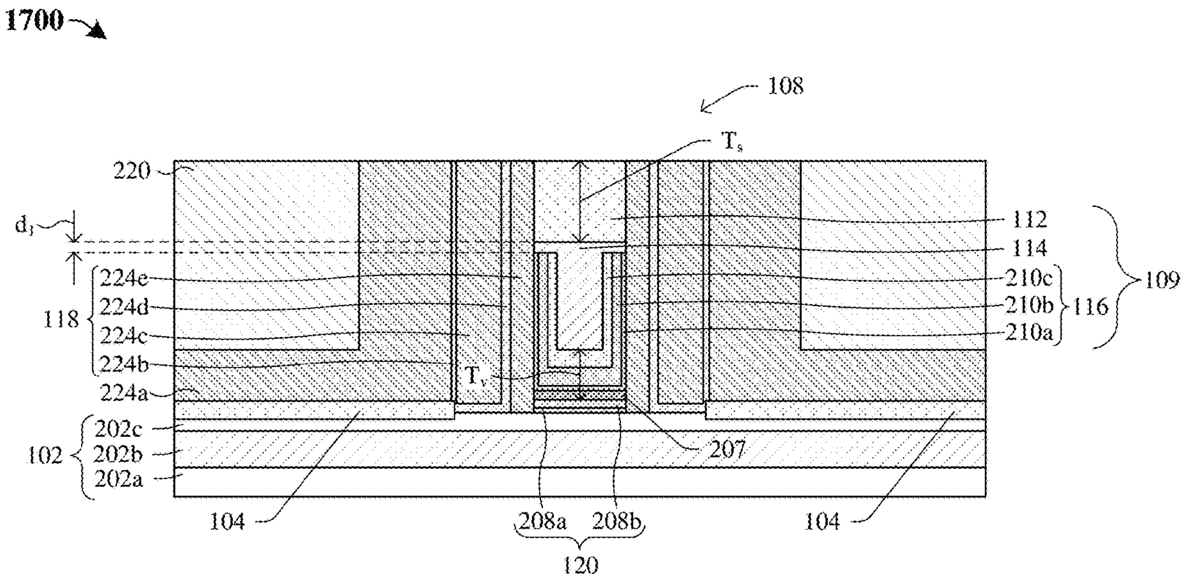

As shown in cross-sectional view 1700 of FIG. 17, a silicide process is performed on the structure of FIG. 16 to convert a portion of the gate body layer 114 into a silicide layer 112, thereby defining a gate structure 109. In some embodiments, the silicide process includes forming a conductive layer (not shown) over the structure of FIG. 16, and subsequently performing an annealing process to convert the conductive layer and the portion of the gate body layer 114 into the silicide layer 112. The gate body layer 114 has a T-shape such that a top surface of the gate body layer 114 is vertically above the top surface of the work function structure 116 by a distance $d_1$. In some embodiments, the distance $d_1$ may be within a range of about 1 to 10 nanometers. In alternative embodiments, a top surface of the gate body layer 114 is vertically below the top surface of the work function structure 116 (see, e.g., FIG. 3B). A thickness $T_s$ of the silicide layer 112 is greater than the thickness $T_v$ of the work function structure 116. In some embodiments, the silicide process is performed such that the thickness $T_s$ of the silicide layer 112 is within a range of about 5 to 30 nanometers.

Figure 18:
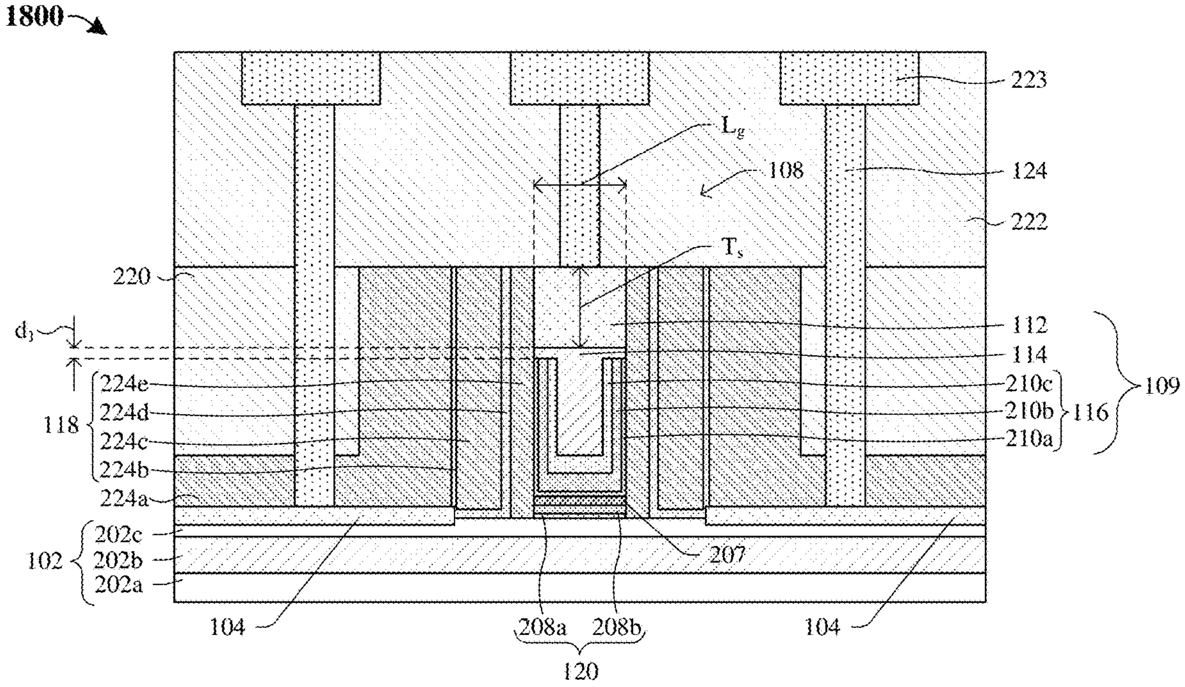

As shown in cross-sectional view 1800 of FIG. 18, a second ILD layer 222 is formed over the first ILD layer 220. Conductive vias 124 and conductive wires 223 are formed over the source/drain regions 104 and the silicide layer 112.

In some embodiments, the second method of FIGS. 11-18 may be altered to form the semiconductor device 300*c* of FIG. 3C. For example, at FIG. 15, the gate body layer 114 may be formed such that the gate body layer 114 is a single material and is or comprises aluminum or some other suitable metal. In the aforementioned example, the silicide process performed at FIG. 17 may be omitted, such that the gate structure 109 is defined after performing the planarization process of FIG. 16. By simplifying the fabrication of the gate structure 109, cost and time associated with formation of the semiconductor device 300*c* of FIG. 3C may be reduced. In some embodiments, the gate body layer 114 is formed in such a manner that outer sidewalls of the gate body layer 114 are aligned with outer sidewalls of the work function structure 116. This, in part, facilities formation of the gate body layer 114 around inner sidewalls of the work function structure 116 and over the top surface of the work function structure 116. By virtue of the profile of the gate body layer, the length $L_g$ of the gate structure 109 may be reduce, for example, to less than 26 nanometers.

Figure 19:
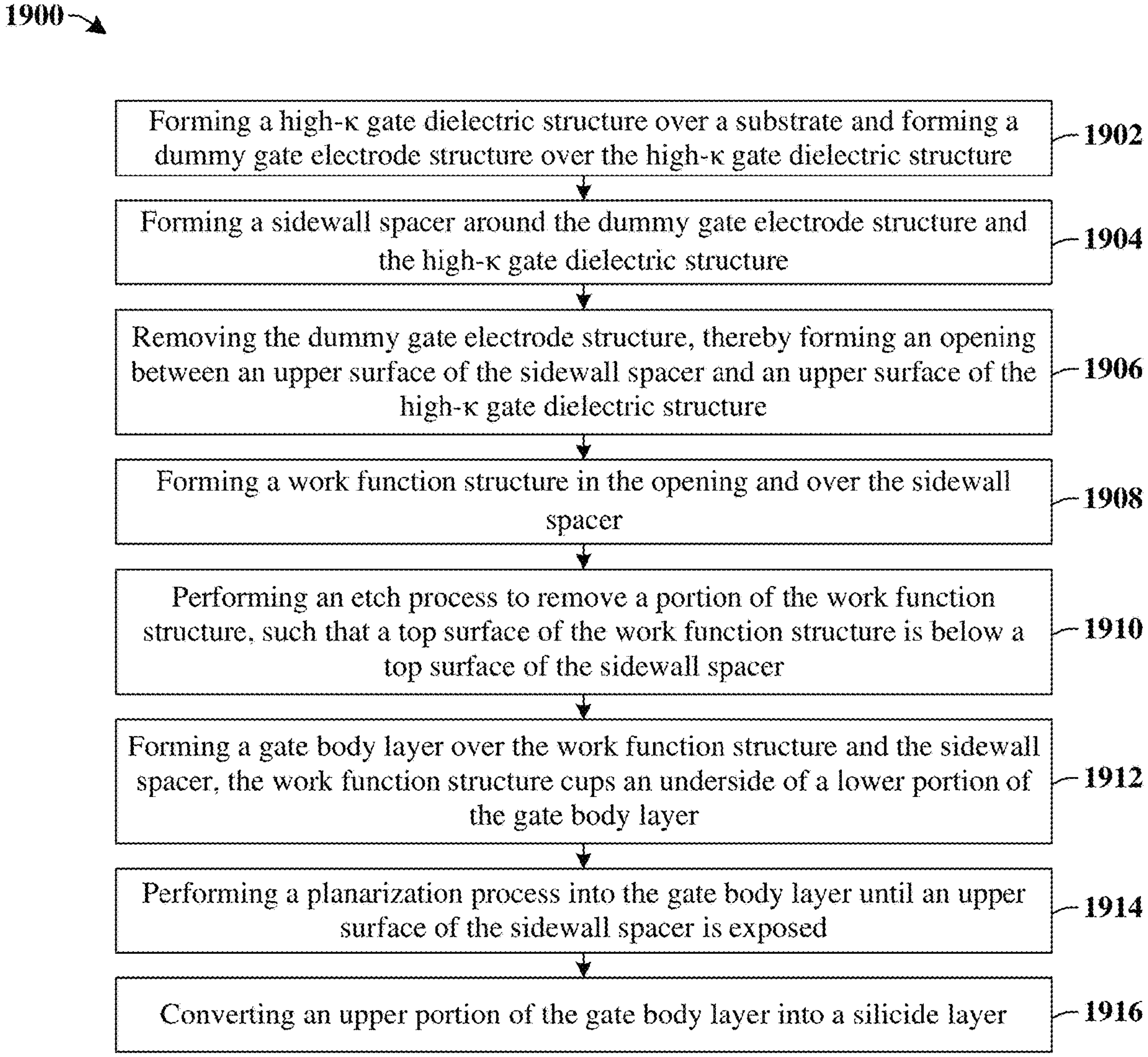
FIG. 19 illustrates a methodology in flowchart format that illustrates some embodiments of the second method of forming the semiconductor device including a gate structure overlying a high-κ gate dielectric structure.

FIG. 19 illustrates a method 1900 of forming a semiconductor device including a high-κ metal gate (HKMG) structure according to the present disclosure. Although the method 1900 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. In some embodiments, the method 1900 relates to the second method of FIGS. 11-18.

At act 1902, a high-κ gate dielectric structure is formed over a substrate and a dummy gate electrode structure is formed over the high-κ gate dielectric structure. FIG. 11 illustrates a cross-sectional view 1100 corresponding to some embodiments of act 1902.

At act 1904, a sidewall spacer is formed around the dummy gate electrode structure and the high-κ gate dielectric structure. FIG. 11 illustrates a cross-sectional view 1100 corresponding to some embodiments of act 1904.

At act 1906, the dummy gate electrode structure is removed, thereby forming an opening between an upper surface of the sidewall spacer and an upper surface of the high-κ gate dielectric structure. FIG. 12 illustrates a cross-sectional view 1200 corresponding to some embodiments of act 1906.

At act 1908, a work function structure is formed in the opening and over the sidewall spacer. FIG. 13 illustrates a cross-sectional view 1300 corresponding to some embodiments of act 1908.

At act 1910, an etching process is performed to remove a portion of the work function structure, such that a top surface of the work function structure is below a top surface of the sidewall spacer. FIG. 14 illustrates a cross-sectional view 1400 corresponding to some embodiments of act 1910.

At act 1912, a gate body layer is formed over the work function structure and the sidewall spacer, such that the work function structure cups an underside of a lower portion of the gate body layer. FIG. 15 illustrates a cross-sectional view 1500 corresponding to some embodiments of act 1912.

At act 1914, a planarization process is performed into the gate body layer until an upper surface of the sidewall spacer is exposed. FIG. 16 illustrates a cross-sectional view 1600 corresponding to some embodiments of act 1914.

At act 1916, an upper portion of the gate body layer is converted into a silicide layer. FIG. 17 illustrates a cross-sectional view 1700 corresponding to some embodiments of act 1916.

Accordingly, in some embodiments, the present application provides a method for forming a transistor that includes a gate structure including a silicide layer and a gate body layer surrounded by a work function structure with two planarization processes. In further embodiments, the present application provides a transistor that includes a gate structure comprising a gate body layer and a work function structure. The gate body layer has a top surface that is vertically offset from a top surface of the work function structure and further has a lower portion cupped by the work function structure.

In some embodiments, the present application provides a semiconductor device including a pair of spacer segments on a semiconductor substrate; a high-κ gate dielectric structure overlying the semiconductor substrate, wherein the high-κ gate dielectric structure is laterally between and borders the spacer segments; and a gate structure over the high-k gate dielectric structure and having a top surface about even with top surface of the spacer segments, wherein the gate structure includes a metal structure and a gate body layer, wherein the gate body layer has a top surface that is vertically offset from a top surface of the metal structure and further has a lower portion cupped by the metal structure.

In some embodiments, the present application provides a semiconductor device including a pair of source/drain regions in a semiconductor substrate; a high-κ gate dielectric structure overlying the semiconductor substrate, wherein the high-k gate dielectric structure is laterally between and borders the source/drain regions; and a gate structure overlying the high-κ gate dielectric structure, wherein the gate structure includes a gate body layer and a silicide layer that are stacked, wherein the gate structure further includes a work function structure wrapping around a bottom of the gate body layer and extending along sidewalls of the gate body and silicide layers to a top surface of the work function structure, and wherein the top surface of the work function structure is about even with a top surface of the silicide layer.

In some embodiments, the present application provides a method for manufacturing a semiconductor device, the method including forming a dummy gate structure over a semiconductor substrate, wherein the dummy gate structure includes a high-κ gate dielectric structure overlying the semiconductor substrate and further includes a dummy gate electrode overlying the high-κ gate dielectric structure, and wherein a sidewall spacer surrounds the dummy gate structure; replacing the dummy gate electrode with a stack of gate electrode layers, wherein the stack of gate electrode layers includes metal layers and a polysilicon layer overlying the metal layers; converting an upper portion of the polysilicon layer into a silicide layer; and performing a planarization process into the stack of gate electrode layers and the silicide layer until an upper surface of the sidewall spacer is exposed, thereby defining a gate electrode structure, wherein the planarization process partially removes the silicide layer.

In some embodiments, the present application provides a method for manufacturing a semiconductor device, the method including forming a dummy gate structure over a semiconductor substrate, wherein the dummy gate structure includes a high-κ gate dielectric structure overlying the semiconductor substrate and further including a dummy gate electrode over the high-κ gate dielectric structure, and wherein a sidewall spacer surrounds the dummy gate structure; replacing the dummy gate electrode with a stack of metal layers, such that the stack of metal layers overlies the high-κ gate dielectric structure and the sidewall spacer; performing an etching process to remove a portion of the stack of metal layers overlying the sidewall spacers and to recess a top surface of the stack of metal layers to below a top surface of the sidewall spacer; and forming a gate body over the stack of metal layers, wherein a lower portion of the gate body is surrounded by the stack of metal layers and an upper portion of the gate body overhangs the stack of metal layers. In some embodiments, wherein the forming of the gate body includes forming a polysilicon layer over the stack of metal layers and the sidewall spacer, wherein the polysilicon layer has a lower portion surrounded by the stack of metal layers; performing a planarization process into the polysilicon layer until the top surface of the sidewall spacer is exposed; forming a conductive layer over the polysilicon layer; and performing an annealing process on the polysilicon layer and the conductive layer, thereby converting an upper portion of the polysilicon layer into a silicide layer, wherein outer sidewalls of the silicide layer are aligned with outer sidewalls of the stack of metal layers. In some embodiments, the silicide layer continuously extends from the top surface of the sidewall spacer to a point below the top surface of the stack of metal layers. In some embodiments, a bottom surface of the silicide layer is above a top surface of the stack of metal layers and the silicide layer is separated from the stack of metal layers by the polysilicon layer. In some embodiments, the forming of the gate body includes forming a conductive layer over the stack of metal layers and the sidewall spacer, wherein the conductive layer includes a single material; and performing a planarization process into the conductive layer until a top surface of the sidewall spacer is exposed. In some embodiments, the single material is aluminum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:

a gate dielectric structure on a semiconductor substrate; and a gate electrode structure on the gate dielectric structure, wherein the gate electrode structure comprises a lower conductive structure and a gate body structure, wherein the gate body structure comprises an upper segment over a top surface of the lower conductive structure and a lower segment disposed between opposing inner sidewalls of the lower conductive structure, wherein the lower segment is T-shaped and the upper segment overlies the lower segment, wherein the upper segment comprises a first conductive material and the lower segment comprises a second conductive material different from the first conductive material, wherein the lower conductive structure comprises a plurality of conductive layers including a first conductive layer and a second conductive layer, wherein the first conductive layer comprises a material different from a material of the second conductive layer.

2. The integrated chip of claim 1, wherein the first conductive material is a silicide of the second conductive material.

3. The integrated chip of claim 1, wherein the lower segment has a lower surface in physical contact with the top surface of the lower conductive structure.

4. The integrated chip of claim 3, wherein a height of the upper segment is less than a height of the lower segment.

5. The integrated chip of claim 1, wherein top surfaces of the first and second conductive layers are aligned and define the top surface of the lower conductive structure.

6. The integrated chip of claim 1, further comprising:

a sidewall spacer abutting a sidewall of the gate electrode structure, wherein the sidewall spacer comprises a first dielectric layer and a second dielectric layer, wherein the second dielectric layer comprises an L-shaped segment laterally spaced from the gate body structure by a thickness of the first dielectric layer.

7. The integrated chip of claim 1, wherein a thickness of the lower segment over the lower conductive structure is less than a thickness of the upper segment.

8. The integrated chip of claim 7, wherein a lateral distance between a first sidewall of the opposing inner sidewalls and an adjacent outer sidewall of the lower conductive structure is greater than the thickness of the lower segment over the lower conductive structure.

9. The integrated chip of claim 8, wherein the lateral distance is less than a distance between the opposing inner sidewalls of the lower conductive structure.

10. The integrated chip of claim 1, wherein a thickness of the upper segment is greater than a vertical distance between a bottom surface of the lower segment and a top surface of the semiconductor substrate.

11. An integrated chip, comprising:

a gate dielectric structure on a semiconductor substrate;

a pair of source/drain regions in the semiconductor substrate and on opposing sides of the gate dielectric structure; and a gate electrode structure on the gate dielectric structure, wherein the gate electrode structure comprises a lower conductive structure on the gate dielectric structure, a conductive gate layer on the lower conductive structure, and a silicide layer on the conductive gate layer, wherein opposing sidewalls of the silicide layer are aligned with opposing sidewalls of the lower conductive structure, wherein inner sidewalls of the lower conductive structure contact first opposing sidewalls of the conductive gate layer, wherein a bottom surface of the silicide layer is vertically offset from a top surface of the lower conductive structure by a lateral segment of the conductive gate layer, wherein a height of the lateral segment is less than a height of the silicide layer, wherein the height of the silicide layer is less than a height of the lower conductive structure.

12. The integrated chip of claim 11, wherein the lower conductive structure comprises a plurality of metal layers, wherein a bottommost metal layer in the plurality of metal layers has a thickness less than a height of the lateral segment.

13. The integrated chip of claim 11, wherein the conductive gate layer comprises a vertical segment under the lateral segment, wherein the lower conductive structure extends along sidewalls of the vertical segment, and wherein a height of the vertical segment is greater than a vertical distance between an upper surface of the lower conductive structure and an upper surface of the gate dielectric structure.

14. The integrated chip of claim 11, wherein second opposing sidewalls of the conductive gate layer are aligned with opposing sidewalls of the silicide layer.

15. The integrated chip of claim 11, wherein a width of the silicide layer is equal to a width of the gate dielectric structure.

16. An integrated chip, comprising:

a gate dielectric structure over a semiconductor substrate;

a pair of source/drain regions on opposing sides of the gate dielectric structure;

a gate electrode over the gate dielectric structure, wherein the gate electrode comprises a conductive structure, a first gate layer, and a second gate layer, wherein the conductive structure comprises a first conductive layer and a second conductive layer, wherein top surfaces of the first and second conductive layers define a top surface of the conductive structure, wherein the first conductive layer comprises a first material and the second conductive layer comprises a second material different from the first material, wherein the first gate layer extends along the top surface of the conductive structure and contacts inner sidewalls of the conductive structure, wherein the second gate layer overlies the first gate layer;

a dielectric structure on the semiconductor substrate, wherein the dielectric structure laterally surrounds the gate dielectric structure and the gate electrode, wherein a top surface of the dielectric structure is aligned with a top surface of the second gate layer, and wherein a distance between the top surface of the dielectric structure and the top surface of the conductive structure is greater than a height of the second gate layer; and a conductive via arranged on the second gate layer.

17. The integrated chip of claim 16, wherein a width of the first gate layer between the inner sidewalls of the conductive structure is greater than a lateral thickness of the conductive structure along a sidewall of the first gate layer.

18. The integrated chip of claim 16, wherein the first gate layer comprises a first conductive material and the second gate layer comprises a second conductive material different from the first conductive material, wherein the first and second conductive materials are different from the first and second materials.

19. The integrated chip of claim 16, wherein a first vertical distance between the top surface of the conductive structure and a bottom surface of the second gate layer is less than a second vertical distance between a bottom surface of the first gate layer and a top surface of the gate dielectric structure.

20. The integrated chip of claim 1, wherein a bottommost surface of the upper segment is vertically spaced above the top surface of the lower conductive structure by a first distance greater than a thickness of the second conductive layer.

* * * * *